United States Patent
Tan et al.

(10) Patent No.: US 6,200,904 B1
(45) Date of Patent: Mar. 13, 2001

(54) METHOD OF FORMING A CONTACT HOLE OF A DRAM

(75) Inventors: Wayne Tan, Taipei; Gwo-Shii Yang; Kun-Chi Lin, both of Hsin-Chu, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/323,546

(22) Filed: Jun. 1, 1999

(51) Int. Cl.⁷ .................................................. H01L 21/302
(52) U.S. Cl. ........................ 438/706; 438/712; 438/721; 438/723
(58) Field of Search ..................................... 438/396, 397, 438/618, 700, 712, 253, 586, 590, 592, 593, 706, 721, 723

(56) References Cited

U.S. PATENT DOCUMENTS

| | | | | |
|---|---|---|---|---|
| 5,204,286 | * | 4/1993 | Doan | 438/618 |
| 5,627,095 | * | 5/1997 | Koh et al. | 438/702 |
| 5,763,306 | * | 6/1998 | Tsai | 438/398 |
| 5,770,510 | * | 6/1998 | Lin et al. | 438/396 |
| 6,025,247 | * | 2/2000 | Chang et al. | 438/396 |
| 6,037,216 | * | 3/2000 | Liu et al. | 438/672 |

* cited by examiner

*Primary Examiner*—Benjamin Utech
*Assistant Examiner*—Duy-Vu Deo
(74) *Attorney, Agent, or Firm*—Winston Hsu

(57) ABSTRACT

The present invention relates to a method of forming a contact hole of a DRAM on the semiconductor wafer. The semiconductor wafer comprises a substrate, a first dielectric layer, two bit lines on the first dielectric layer, a second dielectric layer, and a photo-resist layer comprising an opening to define the pattern of the contact hole. The method comprises performing a first anisotropic etching process to vertically remove a portion of the two dielectric layers and two bit lines to grossly form the contact hole, removing the photo-resist layer in its entirety, performing a thermal oxidation to form a silicon oxide layer on the side walls of the two bit lines, then forming a silicon nitride layer on the surface of the contact hole, and performing a dry etching to remove the silicon nitride layer. There is a silicon oxide layer and a silicon nitride layer between the bit line and the contact hole, and the contact area of the contact hole will not be reduced.

8 Claims, 4 Drawing Sheets

METHOD OF FORMING A CONTACT HOLE OF A DRAM

BACKGROUND OF THE INVENTION

1. Field of Invention

The present invention relates to a DRAM, and more particularly to a method of forming a contact hole of a DRAM.

2. Description of the Prior Art

A DRAM is an element in semiconductor processing that is formed by a large number of single transistors and is a combination of DRAM memory cells. Each DRAM memory cell is formed by a metal oxide semiconductor (MOS) transistor connected in series to a capacitor. Each MOS transistor and capacitor is electrically connected by several word lines and bit lines to determine the address of every memory cell. The DRAM controls the opening and closing of the channel between the source and drain by controlling the voltage of the word line and generating "0" and "1" signals in the memory cell.

When the memory cell has a relatively high voltage a "1" signal is generated and the PN junction of the MOS transistor's drain on the substrate connected to the capacitor is unstable. In time, the capacitor will start to leak current. Therefore, the charge of the memory cell has to be refreshed cyclically if the voltage is to be maintained, otherwise current may leak causing the storage signal of "1" in the memory cell to fall to "0".

Please refer to FIG. 1. FIG. 1 is a drawing of the structure of the memory cell 10 of a stack DRAM according to the prior art. A memory cell 10 of the DRAM is formed on a semiconductor wafer and comprises a Si substrate 12, a MOS transistor 14 on the Si substrate, a dielectric layer 16 position on the Si substrate 12 and the MOS transistor 14, two bit lines 18 within the dielectric layer 16 for transmitting information, a capacitor 20 for storing the charge and data, and a word line 22 for interconnecting the memory cells. The capacitor comprises an fieldplate 24 formed by doped polysilicon as its upper layer, a storage node 26 as its lower layer and an interposed unit cell dielectric layer 28 with an oxide-nitride-oxide (ONO) structure between the field plate 24 and the storage node 26.

In the formation of the memory cell 10, the first step is to form the MOS transistor 14, dielectric layer 16 and two bit lines 18 on the Si substrate 12. Then, a contact hole 21 is formed within the dielectric layer 16 to be used as a node contact for the storage node 26 of the capacitor 20. The contact hole 21 is formed vertically along the side walls of the two bit lines 18 while removing the dielectric layer 16 to the surface of the MOS transistor 14. A silicon oxide layer 25 is then formed on the side walls of the two bit lines 18 followed by formation of a spacer 23 made of silicon nitride on the contact hole 21. The spacer 23 serves as an electrical insulating layer between the storage node 26 and the bit line 18 and prevents electrical connection between the capacitor 20 and bit line 18. This in turn prevents leakage of current. Lastly, the contact hole 21 is cleaned and the storage node 26, the ONO dielectric layer 28 and the field plate 24 are formed. This completes the production of the capacitor 20 and memory cell 10.

The cleaning solution used to clean the contact hole 21 may etch the exposed silicon oxide layer 25 in the contact hole 21 causing breakdown of the insulation between the storage node 26 and bit lines 18. Further, the spacer 23 of the contact hole 21 is in direct contact with the drain on the Si substrate 12. However, since the spacer 23 and the Si substrate 12 have different thermal expansion coefficients, thermal stress occurs in the contact region of the spacer 23 and the Si substrate 12 causing leakage of current in the PN junction on the Si substrate. This effect reduces the capability of storage charge of the capacitor 20 and increases the refresh frequency of the signal of the memory cell 10 so as to reduce the performance of the stack DRAM.

SUMMARY OF THE INVENTION

It is therefore a primary objective of the present invention to provides a method of forming a contact hole of a DRAM to solve the above mentioned problem.

In a preferred embodiment, the present invention relates to a method of forming a contact hole of a DRAM, the DRAM being formed in a semiconductor wafer and comprising:

a substrate;

a first dielectric layer positioned on the substrate;

two bit lines positioned on the first dielectric layer each having a rectangular-shaped cross section;

a second dielectric layer positioned on the first dielectric layer and two bit lines; and a photo-resist layer positioned on the second dielectric layer, the photo-resist layer comprising an opening positioned above the space between the two bit lines and partially overlapping the two bit lines;

wherein the method of forming the contact hole comprises:

performing a first anisotropic etching process to vertically remove the second dielectric layer under the opening down to the top ends of two bit lines, and then continuing the process along the side walls of the two bit lines to vertically remove the second dielectric layer positioned between the two bit lines and the first dielectric layer in a downward direction to grossly form the contact hole while retaining a predetermined thickness of the first dielectric layer on the substrate;

performing a second anisotropic etching process to vertically remove the portions of the two bit lines under the opening down to the first dielectric layer;

removing the photo-resist layer in its entirety;

performing a thermal oxidation to form an insulating layer on the side walls of the two bit lines in the contact hole;

forming a passivation layer on the second dielectric layer and the surface of the contact hole to protect the insulating layer on the side wall of the two bit lines in the contact hole; and performing a third etching process on the surface of the second dielectric layer and contact hole to remove the passivation layer and the remaining first dielectric layer from the bottom of the contact hole down to the substrate to complete the contact hole.

It is an advantage of the present invention that etching of the silicon oxide layer by the cleaning solution is prevented and the problem of thermal stress on the spacer is eliminated. This ensures proper insulation between the bit line and the contact hole of the capacitor.

Those and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
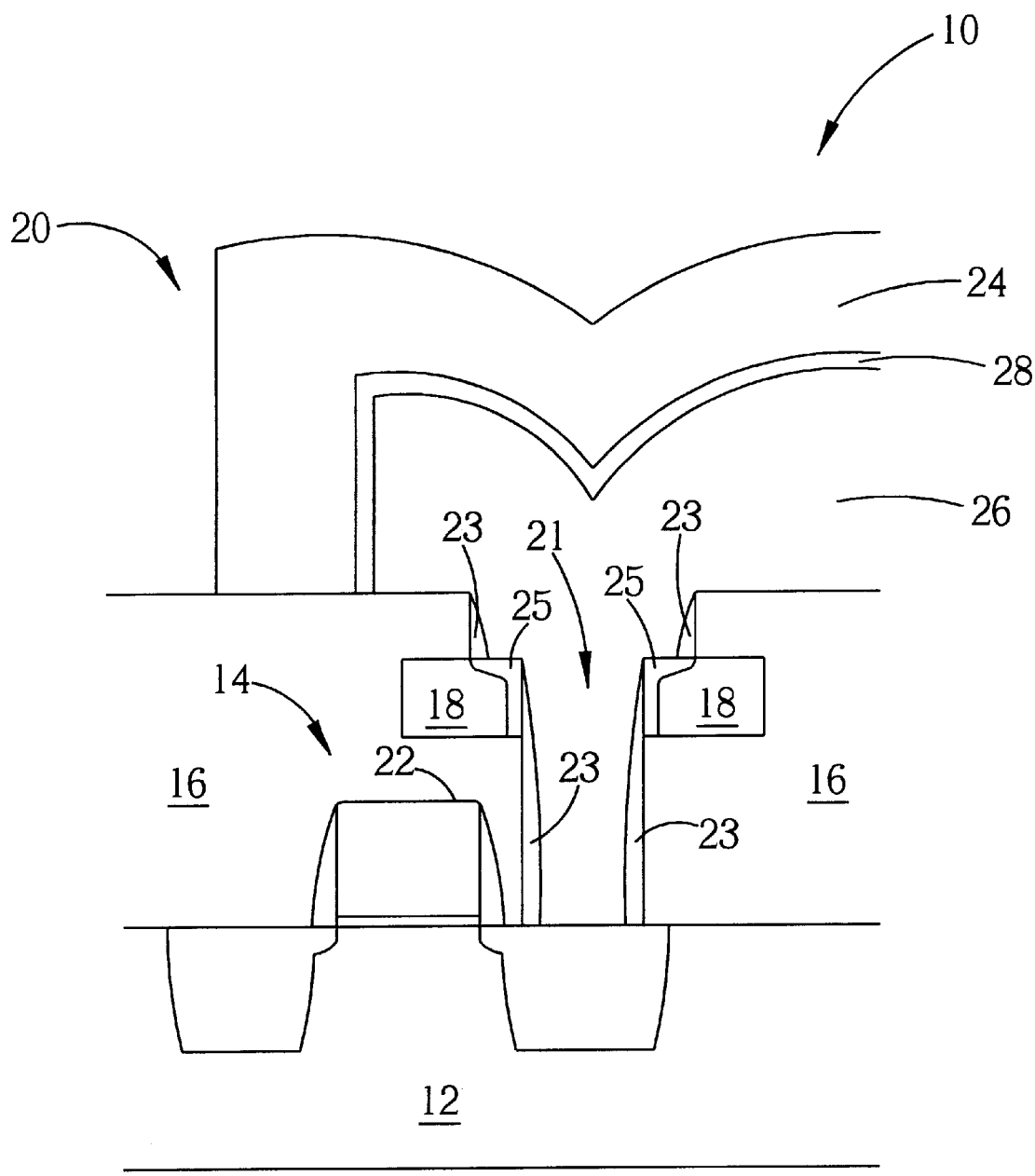
FIG. 1 is a drawing of the structure of the memory cell of a stack DRAM according to the prior art.
Figure 2:
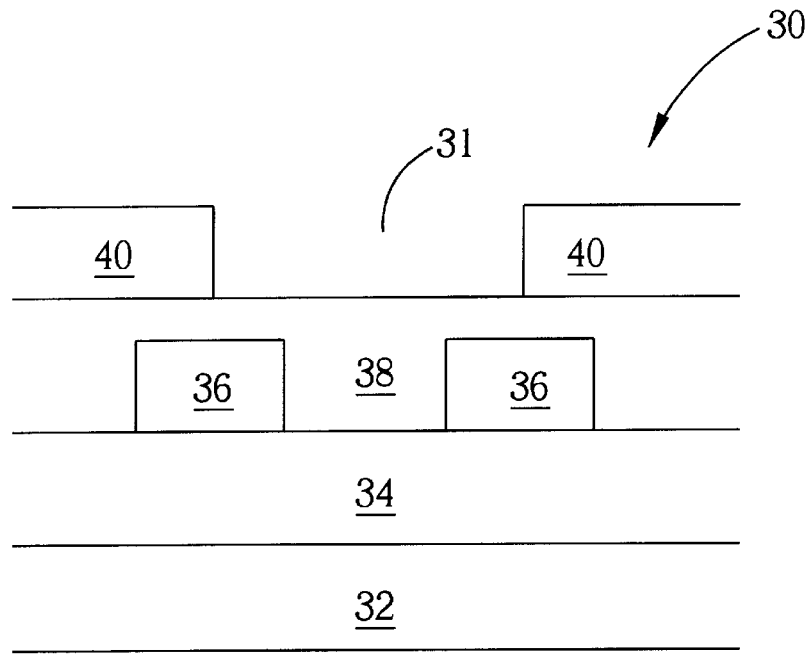
FIG. 2 to FIG. 7 are drawings illustrating the formation of the contact hole of a DRAM according to the prior art.

Please refer to FIG. 2 to FIG. 7. FIG. 2 to FIG. 7 are drawings illustrating the formation of the contact hole of a DRAM according to the prior art. The formation of the contact hole of the DRAM in the present invention is performed on a semiconductor wafer 30. As shown in FIG. 2, the semiconductor wafer 30 comprises a Si substrate 32, a first dielectric layer 34 positioned on the Si substrate 32, two bit lines 36 positioned on the first dielectric layer 34 each having a rectangular-shaped cross section, a second dielectric layer 38 positioned on the first dielectric layer 34 and two bit lines 36, and a photo-resist 40 layer positioned on the second dielectric layer 38. The photo-resist layer 40 comprises an opening 31 positioned above the space between the two bit lines 36 and partially overlapping the two bit lines 36 thus defining the pattern of the contact hole 30. The first dielectric layer 34 and the second dielectric layer 38 are made of undoped silicate glass (USG). Each bit line 36 comprises a poly-silicon layer on the first dielectric layer 34, and a tungsten silicide layer on the poly-silicon layer.

Figure 3:
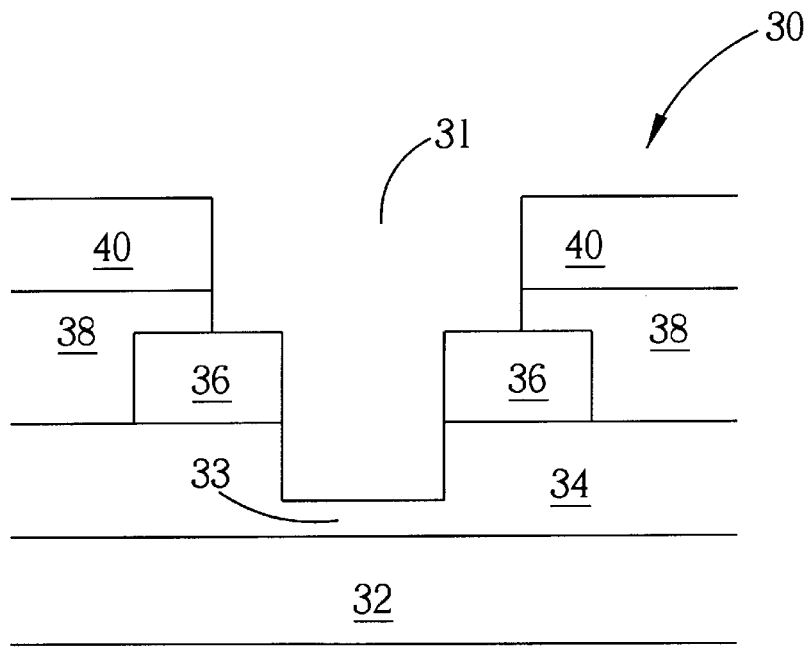
Figure 4:
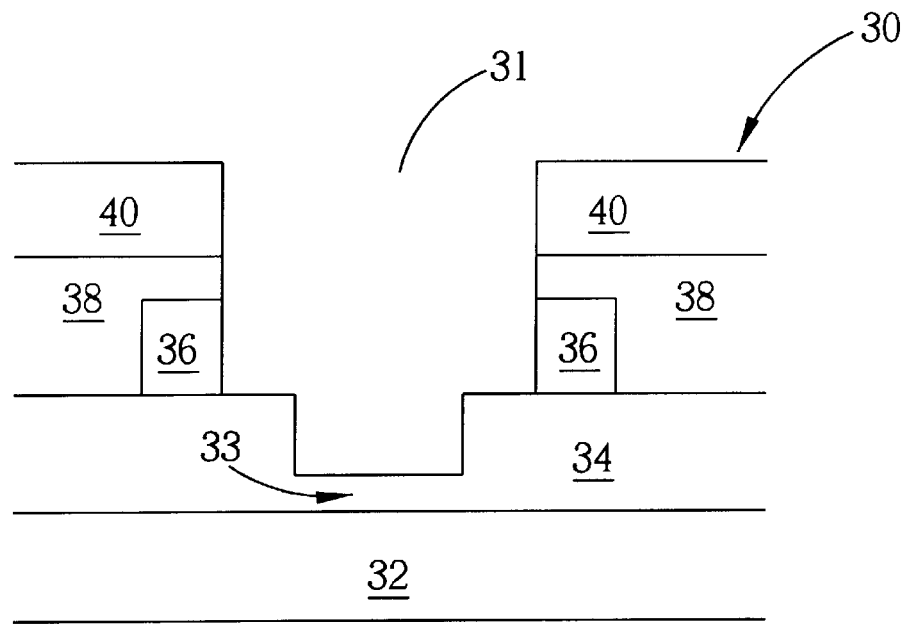

As shown in FIG. 3, in the formation of the contact hole 50, first anisotropic etching is performed to grossly form the contact hole. The first anisotropic etching process is a dry etching process in which reactive ion etching (RIE) is used to remove the second dielectric layer 38 and the first dielectric layer 34. First, first anisotropic etching vertically removes the second dielectric layer 38 under the opening 31 down to the top ends of two bit lines 36, and then continues along the side walls of the two bit lines 36 to vertically remove the second dielectric layer 38 between the two bit lines 36 and a portion of the first dielectric layer in a downward direction. A predetermined thickness of the first dielectric layer 34 is retained on the Si substrate 32. As shown in FIG. 4, second anisotropic etching is performed to vertically remove the portions of the two bit lines 36 under the opening 31 down to the first dielectric layer 34.

Figure 5:
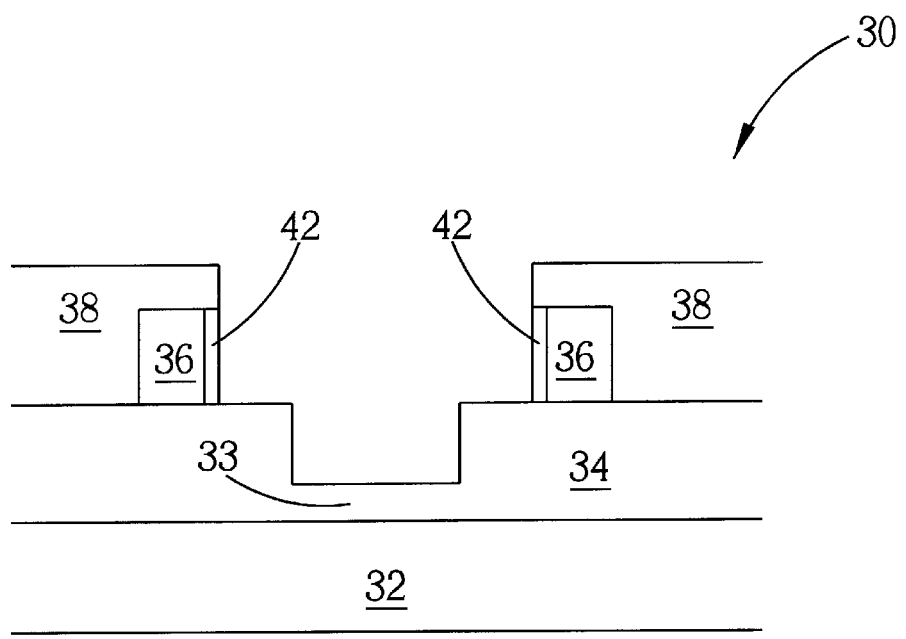
Figure 6:
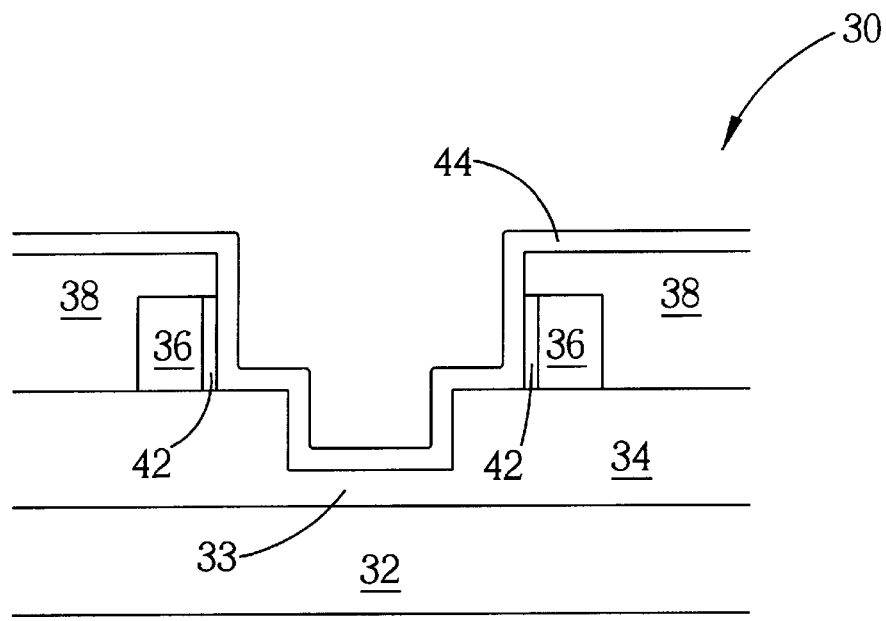

As shown in FIG. 5, removal of the photo-resist layer 40 is performed in which dry etching with plasma is used to remove most of the photo-resist layer 40 and wet etching with hot vitriol is used to remove the remaining photo-resist layer 40. Then, thermal oxidation is performed to form an insulating layer 42 made of silicon oxide on the side walls of the two bit lines 36 in the contact hole 50. As shown in FIG. 6, a passivation layer formed of silicon nitride is deposited onto the surface of the semiconductor wafer 30 by performing a chemical vapor deposition (CVD) process. The passivation layer 44 is used to prevent etching of the insulating layer 42 on the side walls of the two bit lines 36 from occurring during subsequent cleaning of the contact hole 50.

Figure 7:
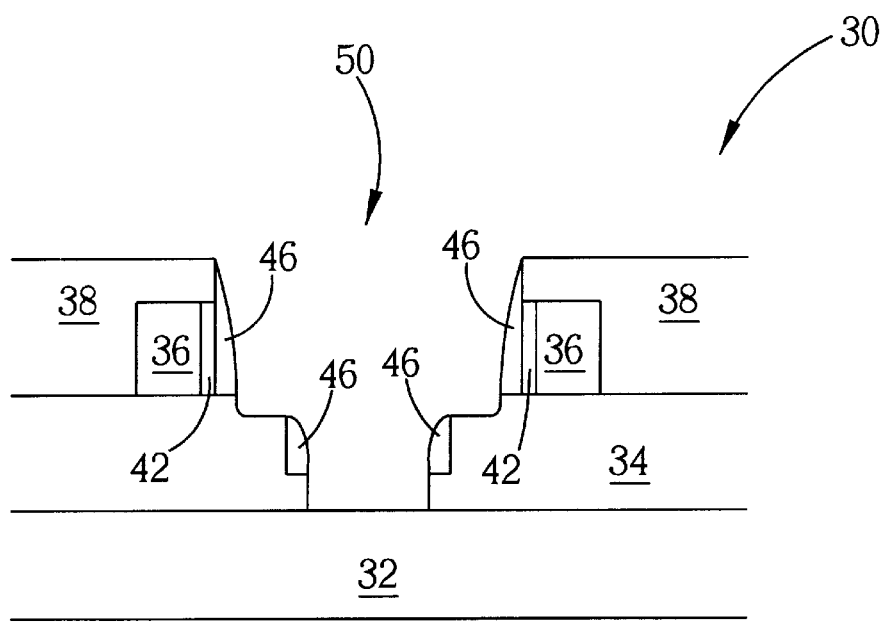

As shown in FIG. 7, a third anisotropic etching process is performed on the surface of the second dielectric layer 38 and contact hole 50 to remove the passivation layer 44 and the remaining first dielectric layer 34 from the bottom of the contact hole 50 down to the substrate 32. The spacer 46 formed on both side walls of the first dielectric layer 34 and second dielectric layer 38 functions as an electrical insulating layer for the two bit lines thus completing the formation of the contact hole 50 in the present invention.

Upon completion of the process, the contact hole 50 has an insulating layer 42 made of silicon oxide and a spacer 46 made of silicon nitride that acts as an electrical insulating layer. The insulting layer 42 only needs to be 200~300 Å thick. The thermal budget of the thermal oxidation is also reduced. Afterward, because the thickness of the spacer 46 covering the insulating layer 42 is 60 Å, it prevents etching of the insulating layer during subsequent cleaning of the contact hole and maintains insulation between the storage node 26 and bit line 18. In the formation of the contact hole 50 according to the present invention, the spacer 46 does not directly contact the surface of the Si substrate 32; therefore, there is no remaining thermal stress and no reduction of the contact area of the contact hole 50 on the Si substrate 32.

In contrast to the prior art method, the contact hole 50 of the present invention has both a spacer 46 and an insulating layer 42 used as an electrical insulating layer for the two bit lines 36 and the contact hole 5O. Therefore, good insulating efficiency is maintained and current leakage of two bit lines 36 is prevented. The spacer 46 in the contact hole 50 does not directly contact the Si substrate, so leakage of current of the PN junction is also prevented.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of forming a contact hole of a dynamic random access memory (DRAM), the dynamic random access memory being formed in a semiconductor wafer and comprising:

a substrate;

a first dielectric layer positioned on the substrate;

two bit lines positioned on the first dielectric layer each having a rectangular-shaped cross section;

a second dielectric layer positioned on the first dielectric layer and two bit lines; and a photo-resist layer positioned on the second dielectric layer, the photo-resist layer comprising an opening positioned above the space between the two bit lines and partially overlapping the two bit lines;

wherein the method of forming the contact hole comprises:

performing a first anisotropic etching process to vertically remove the second dielectric layer under the opening down to the top ends of two bit lines, and then continuing the process along the side walls of the two bit lines to vertically remove the second dielectric layer positioned between the two bit lines and the first dielectric layer in a downward direction to grossly form the contact hole while retaining portosns of the first dielectric layer under the contact hole on the substrate;

performing a second anisotropic etching process to vertically remove the portions of the two bit lines under the opening down to the first dielectric layer;

removing the photo-resist layer in its entirety;

performing a thermal oxidation to form an insulating layer on the side walls of the two bit lines in the contact hole;

forming a passivation layer on the second dielectric layer and the surface of the contact hole to protect the insulating layer on the side wall of the two bit lines in the contact hole; and performing a third etching process on the surface of the second dielectric layer and contact hole to remove the passivation layer and the remaining first dielectric layer from the bottom of the contact hole down to the substrate to complete the contact hole.

2. The method of claim 1 wherein the first dielectric layer and the second dielectric layer are made of undoped silicate glass (USG).

3. The method of claim 1 wherein the two bit lines comprise:

a poly-silicon layer on the first dielectric layer; and a tungsten silicide layer on the poly-silicon layer.

4. The method of claim 1 wherein the first anisotropic etching process is a dry etching process in which reactive ion etching (RIE) is used to remove the second dielectric layer and the first dielectric layer.

5. The method of claim 1 wherein the second anisotropic etching process is a dry etching process.

6. The method of claim 1 wherein the removing process of the photo-resist layer comprises:

a dry etching process using plasma to remove most of the photo-resist layer;

a wet etching process using hot vitriol to remove the remaining photo-resist layer.

7. The method of claim 1 wherein the insulating layer on the side wall of two bit lines is made of silicon oxide.

8. The method of claim 1 wherein the passivation layer is a silicon nitride layer which is made by using a chemical vapor deposition (CVD) process to prevent etching of the insulating layer during subsequent cleaning of the contact hole.

* * * * *